United States Patent [19]

Hamburgen et al.

[11] Patent Number: 5,776,800
[45] Date of Patent: Jul. 7, 1998

[54] PADDLELESS MOLDED PLASTIC SEMICONDUCTOR CHIP PACKAGE

[76] Inventors: William Riis Hamburgen, 4039 Manzana La., Palo Alto, Calif. 94306; John Stuart Fitch, 36640 Sequoia Ct., Newark, Calif. 94560; Yezdi Naval Dordi, 55B Upland Rd., Cambridge, Mass. 02140

[21] Appl. No.: 730,536

[22] Filed: Oct. 11, 1996

Related U.S. Application Data

[62] Division of Ser. No. 269,294, Jun. 30, 1994, Pat. No. 5,604,376.

[51] Int. Cl.⁶ .................................................. H01L 21/60
[52] U.S. Cl. .................................... 438/122; 438/121
[58] Field of Search .............................. 437/204, 211, 437/214, 215, 217, 218, 219, 220; 438/121, 122, 123, 124

[56] References Cited

U.S. PATENT DOCUMENTS

| | | |
|---|---|---|
| 5,101,324 | 3/1992 | Sato ........................................ 257/787 |
| 5,130,889 | 7/1992 | Hamburgen et al. . |
| 5,309,026 | 5/1994 | Matsumoto . |
| 5,394,298 | 2/1995 | Sagisaka . |
| 5,474,958 | 12/1995 | Djennas et al. ........................ 437/211 |

FOREIGN PATENT DOCUMENTS

| | | |
|---|---|---|
| 1-136356 | 5/1989 | Japan . |
| 1-241831 | 9/1989 | Japan . |
| 2-023640 | 1/1990 | Japan . |
| 2-268449 | 11/1990 | Japan . |
| 2-277259 | 11/1990 | Japan . |
| 4-241444 | 8/1992 | Japan . |

OTHER PUBLICATIONS

Tanaka et al. "Thermal Analysis of Plastic QFP with High Thermal Dissipation", 1992 IEEE ECTC, pp. 332-339.
Djennas et al. "A Novel, Lower Cost, Thermally Enhanced Exposed Silicon Plastic Package (ESPP)", 1994, IEEE ECTC, pp. 67-74.
Nakamura et al. "Effects of Mechanical and Flow Properties of Encapsulating Resin of the Performance of Ultra Thin Carrier Package", 1993, IEEE ECTC, pp. 419-424.
Joiner et al. "Low Cost, Thermally Enhanced QFP", 1993, IEPC, pp. 471-478.

*Primary Examiner*—Kevin Picardat
*Attorney, Agent, or Firm*—Anne E. Saturnelli

[57] ABSTRACT

Disclosed is a semiconductor package and method in which a semiconductor chip is mounted within the opening of a lead frame by bonding wires extending between the active front side of the chip and bonding pads of the lead frame, and the lead frame/chip assembly is encased within a plastic molded body, with the inactive back side of the chip exposed and facing outside the package.

13 Claims, 4 Drawing Sheets

PADDLELESS MOLDED PLASTIC SEMICONDUCTOR CHIP PACKAGE

This is a divisional of application Ser. No. 08/269,294 filed on Jun. 30, 1994, now U.S. Pat. No. 5,604,376.

FIELD OF THE INVENTION

The present invention relates to semiconductor devices, and, in particular, is directed to the packaging of a semiconductor chip.

BACKGROUND OF THE INVENTION

Packaging is one of the final steps in the process of manufacturing semiconductor chips. In packaging, a fabricated semiconductor chip is mounted within a protective housing. At the present moment, the art of semiconductor chip technology has evolved far more rapidly than the integrally related technology of packaging the semiconductor chips. The packaging requirements of the newer, smaller, more powerful semiconductor chips are quickly progressing beyond the capabilities of traditional packaging technology and the conventional materials and designs presently utilized are fast becoming obsolete. The packaging demands of new semiconductors require configurations to accommodate increasing numbers of electrical interconnections, space constraints due to decreasing size, reduction in costs, improved reliability, and increasing heat transfer capabilities.

The need to adequately transfer heat out of increasingly smaller semiconductor packages has spawned significant interest in the development of new packaging materials and more thermally efficient configurations. Currently, semiconductor packaging utilizes the art of attaching an external, heat sink to improve the heat transfer characteristics of many chip packages which, by themselves, do not adequately transfer heat away from the semiconductor chip. However, with the increasing heat concentration of new semiconductor chips the standard addition of an external heat sink is no longer sufficiently thermally efficient.

In packaging technology, the two most significant modes of heat transfer are heat conduction and heat convection. The removal of heat through a medium or between media is based on temperature differential, i.e. heat flowing from hot to cold, until an equilibrium is reached. Both convection and conduction heat transfer modes are paramount in evaluating the heat transfer characteristics of semiconductor packages and/or attached heatsink members.

The heat dissipating characteristics of semiconductor packages are measured by a network of heat transfer pathways through which heat must flow. The heat must be conducted from the chip through various thermal pathways to reach an outer surface of the package exposed to a cooling fluid, such as air. The fluid then convects away the heat.

Every packaging material has its own unique thermal characteristics, one of these characteristics is known as thermal conductivity. The thermal conductivity of a material determines the amount of heat that can be conducted through that material. Some materials (such as metals) have high thermal conductivity, and other materials (such as rubber or glass) have low thermal conductivity. Common semiconductor packaging materials, such as glass, glass ceramic composites, and plastics, which allow for ease of manufacturing, unfortunately also feature low thermal conductivities which hinder the dissipation of heat.

Depending on the construction of the semiconductor package, a package may have a multitude of various materials of various thermal conductivities through which heat must travel to reach the cooling fluid. This path may be tortuous when many materials with low thermal conductivities are encountered.

Once heat from the semiconductor chip has been conducted through the various materials of the package and reaches the surface of the package it must be convected away to a cooling fluid, such as air.

As noted previously, heat transfer from the external surfaces of semiconductor packages is normally handled by the attachment of specially configured heat sinks which, generally, are mounted over the areas of greatest heat generation. This allows the hoat to be conducted from the surface of the package, whichusually has a low thermal conductivity, into the heat sink, which preferably has a high thermal conductivity and a large surface area. The heat then is convected away to the ambient air mass. The shapes of the heat sinks are configured to allow for a large surface area which increases heat convection away from the package. In previous applications, where the heat generation of semiconductor chips was moderate, the additional heat transfer capability created by externally bonding the heat sink to the package was sufficient to transfer any heat generated by the chip.

However, as heat generation has increased in the newer semiconductors, the effectiveness of externally mounted heat sinks has decreased. The thermal pathways of the package and heat sink can no longer adequately transfer the heat generated and can subsequently cause malfunctions within the semiconductors.

A major heat transfer problem common to many semiconductor packages is the configuration of the package and the mounting location of the semiconductor chip. Advantageously locating the chip can eliminate several thermal boundaries and improve heat transfer. Because the chip is routinely attached to an internal substrate, the heat generated from the chip must pass through the attachment means to the substrate before it reaches the heat sink mounted on the outer surface of the package. The chip-substrate attachment bonding material adds thermal barriers to the package and limits the maximum heat transfer capability of the package.

Plastic packages introduced decades ago, currently are utilized to package the vast majority of integrated circuits in the semiconductor chip industry. It is estimated that plastic packaging accounts for about 95 percent of the world market in semiconductor chip packaging (or about 40 billion parts per year).

A typical plastic packaging operation involves the following sequence of steps:

1. In order to hold the chip in place, it first is bonded, generally using an epoxy, to a flat surface, commonly referred to as a "paddle", in the center of a lead frame.
2. The chip, held in place on the paddle, then is wire bonded to the lead frame.
3. The lead frame and chip assembly is set within the cavity of a transfer molding fixture and a plastic composition is transferred to fill the cavity, thus encasing the chip, epoxy, paddle, bond wires, and part of the lead frame.
4. The encased assembly is removed from the transfer molding fixture, and the wire leads are trimmed, plated, and formed to specific desired shape.
5. If required for heat dissipation, a heat sink is bonded to the encased assembly.

In standard plastic package assembly, the heat generated by the chip must pass through the epoxy, paddle, and through the plastic encasing the chip, before it reaches the exterior of the plastic. Such an arrangement results in very poor thermal performance, since the epoxy and encasing plastic are poor thermal conductors.

SUMMARY OF THE INVENTION

According to the present invention, an improved plastic chip package has been developed, whereby the non-active back side of a packaged semiconductor chip is exposed and facing outside of the package. This allows several advantages over conventional packaging: the chip to substrate epoxy attach process is eliminated; with no paddle or epoxy, the chip is situated at one face of the package, allowing ample room for bond wire loops, while still making the package thinner; the chip is exposed for direct attachment of a heat sink; less materials means less mismatched material properties, materials with thermal coefficients of expansion (TCE's) and strength different from silicon are eliminated, thereby improving internal stresses and attendent reliability; and cost savings are realized because less materials means less potential manufacturing problems and fewer assembly steps. Such an arrangement is less expensive, thinner, and accomplishes marked thermal performance improvement over standard arrangements wherein chip-generated heat must be conducted through the plastic package.

The presently invented molded plastic semiconductor chip package comprises a conventional leadframe member, featuring, however, an opening therein, where typically a paddle mounting platform would have been provided. A semiconductor chip, having an active front side surface and a nonactive back side surface, is positioned within said opening, with the nonactive back side of the chip fully unsupported by said lead frame. Bonding wires extend between the active front side of the chip and bonding pads of the lead frame. A molded plastic body encases the lead frame, bonding wires, and the semiconductor chip, with the nonactive back side of the chip exposed and facing outside the package. If a heat sink is required, it can be attached in direct contact to the exposed back side of the chip, for efficient and effective heat dissipation.

The present improved package can be made by a process which features simplified steps in comparison with conventional molded plastic package assembly. Firstly, a semiconductor chip is positioned within an opening of a lead frame. The opening of the lead frame has lateral dimensions greater than those of the chip. During fabrication, the chip initially is held in place in a fixture, preferably by vacuum. The leadframe is held in the same fixture either by vacuum means or other conventional means. While held in the fixture, the chip is wire bonded to the lead frame. Conventional ball or stitch bonding may be used.

The entire process of bonding the chip to the paddle is eliminated, along with the attendant problems involved with paddle-chip interface.

After wire bonding is accomplished, the chip and lead frame form a partially completed assembly with structural integrity sufficient to withstand normal handling. The assembly may be removed from the wire bonding fixture at this point, with the chip held in free space supported only by the bond wires.

Next the chip and lead frame assembly is placed into a plastic package mold and held in place as plastic is transferred into the mold, thereby encasing the chip, bond wires, and leads.

To hold the chip and lead frame in place within the mold during the transfer molding process, it is preferred that the back side of the chip be positioned on a pedestal in the mold. Preferably, the pedestal is equipped with a vacuum port to assist in maintaining the chip in position. When the part is removed from the mold, plastic encases the chip, except the area of the chip back side which was in contact with, and accordingly shielded by, the support pedestal. This thus leaves the nonactive back side of the chip exposed and facing outside the package. If a heat sink is required, it readily can be attached directly to the exposed back side of the chip.

BRIEF DESCRIPTION OF THE DRAWINGS

For a further understanding of the nature of the present invention, as well as other features and advantages thereof, reference should be made to the following detailed description taken in conjunction with the accompanying drawings wherein.

DETAILED DESCRIPTION OF PREFERRED EMBODIMENT

Figure 1:
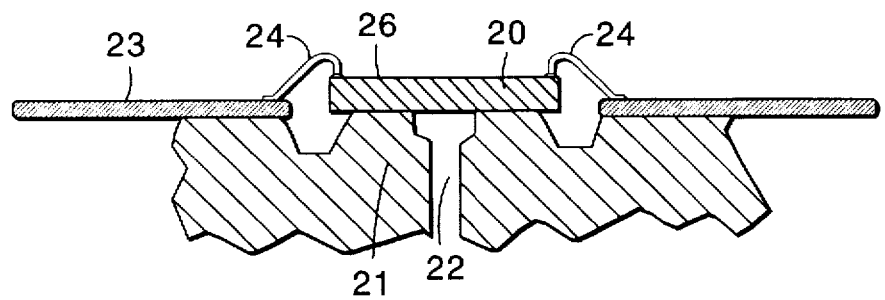
FIGS. 1–3 are cross-sectional views depicting sequential steps in the process for making the molded plastic semiconductor chip package of the present invention.
Figure 2:
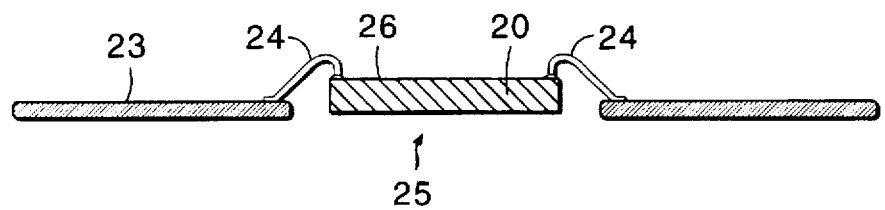

Referring to FIG. 1, a semiconductor chip 20 is shown positioned on a fixture pedestal 21, which is equipped with a vacuum port 22 to assist in holding the chip securely in place during the wire bonding operation. While the chip 20 and lead frame 23 are held on the fixture, bondwires 24 are attached between the active side (26) of the chip 20 and the lead frame by an appropriate ball or stitch bonder (not shown). Once the bondwires are in place, the partially completed assembly 25 (shown in FIG. 2) may be removed from the wire bonding fixture. The chip 20, supported only by bondwires 24 has sufficient integrity to allow removal from the bonding fixture and handling of the partially completed assembly, to accommodate transport to the next subsequent process stage. Alternatively, the chip-lead frame assembly may remain in the fixture to travel to the next stage.

Figure 3:
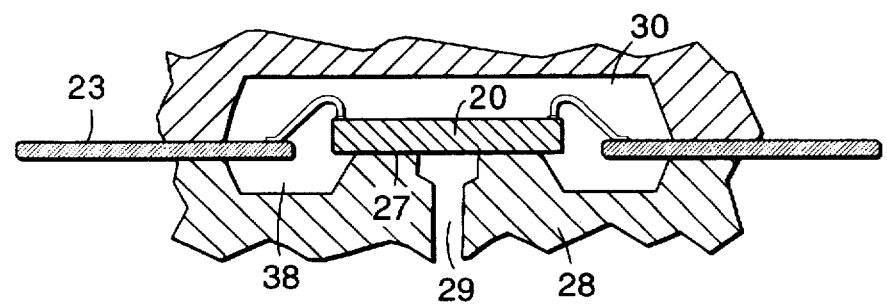

As illustrated in FIG. 3, the chip 20, wirebonded to lead frame 23, is placed in a mold bottom 38 and the non-active back side 27 of chip 20 is positioned over mold fixture pedestal 28. The pedestal features vacuum port 29 to assist in holding the chip in place during the molding process. Once the chip-and lead frame assembly is set in place in the mold cavity, mold top 30 is assembled onto the mold, and, using conventional transfer molding equipment and techniques, a plastic composition is transferred into the mold and flows around the chip, bondwires, and lead frame as it fills the mold cavity.

Figure 4:
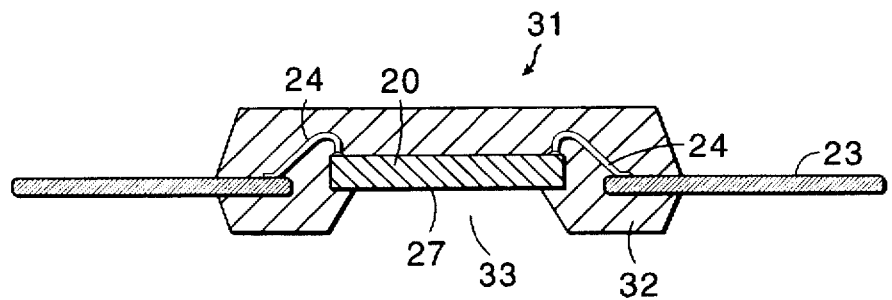
FIG. 4 is a cross sectional view of one embodiment of a semiconductor package according to the invention.

As soon as the plastic sets, the mold top and bottom can be removed and the molded plastic package 31 (FIG. 4) can be removed. The plastic package comprises the chip 20, attached by bondwires 24 and lead frame 23, all encased within plastic molded body 32. The portion of the chip back side 27 previously positioned on the vacuum mold pedestal remains uncovered by plastic and is exposed and facing outside the package within recess 33.

Figure 5:
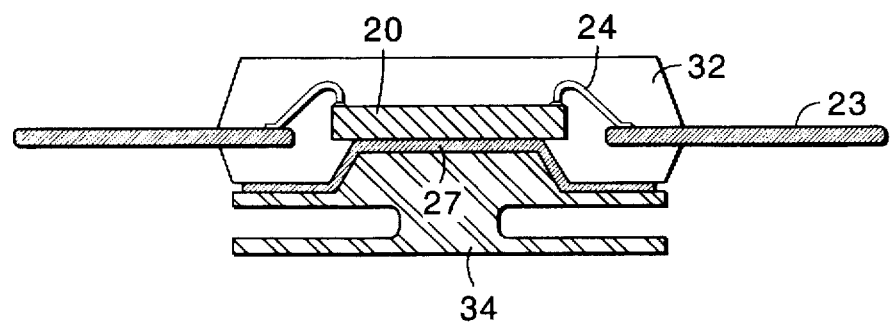
FIG. 5 is a cross sectional view of a fully assembled semiconductor package according to the present invention, including an attached heat sink element.

In FIG. 5, a finished molded plastic package is illustrated, including a heat sink 34 fitted into recess 33 in direct thermal contact with the exposed, nonactive back side 27 of semiconductor chip 20.

Figure 6:
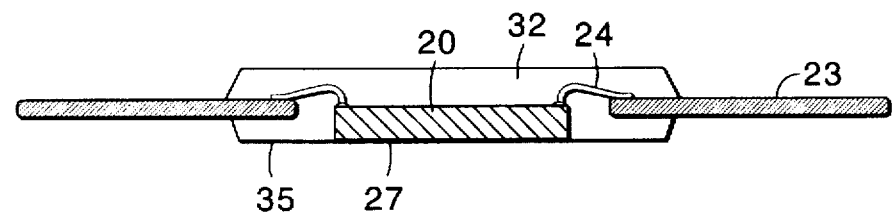
FIGS. 6–13 are sectional views of additional embodiments of semiconductor packages according to the present invention.

FIG. 6 shows an embodiment of the invention designed to create a package featuring the backside 27 of an encased semiconductor chip 20,which is flush with exterior surface 35 of the molded plastic body 32 rather than recessed within. This embodiment offers the advantages of a very thin, lightweight package which can accept a variety of heat sink designs. The leads may exit the mid plane of the plastic, or may be adjusted to accommodate manufacturing steps or applications.

Figure 7:
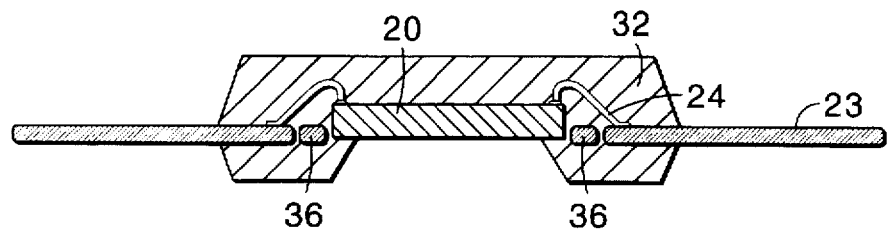

The embodiment of FIG. 7 includes a stress reducing ring 36 molded into the plastic material of molded body 32 to reduce stresses and consequent delaminations between the plastic and the chip 20. The ring could be made of any suitable material chosen for its specific mechanical or electrical properties. Typically, the ring may consist of lead frame material. The ring is situated such that it surrounds the outside edges of the chip 20 but is not in contact with it. The ring may be held in place, during the molding operation, by another vacuum port, in which case, a portion of the ring would be exposed. The ring may also be an integral part of the leadframe, i.e., it would be held in place by an adhesive between the leadframe and the ring.

Figure 8:
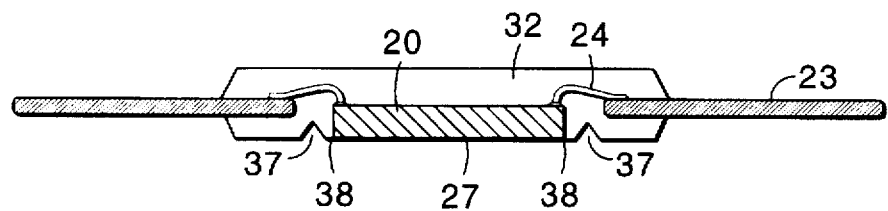

A second stress-reducing embodiment is illustrated in FIG. 8. At the silicon/plastic/air interface 38, there is a tendency for the plastic-to pull away from the silicon, since the plastic in that area is shrinking while it is cooling from the transfer molding temperature, and it shrinks more than the silicon. This difference in thermal contraction creates tension at the silicon/plastic/air interface, often leading to separation. In order to maintain tight contact to seal the joint from the atmosphere, the tension needs to be reduced. Accordingly, a notch 37 is built into the plastic mold body 32 to isolate most of the influence of the plastic body from the joint area. Such a notch readily could be formed, for example, by a positive feature in the mold bottom, and could take on various shapes and configurations.

Figure 9:
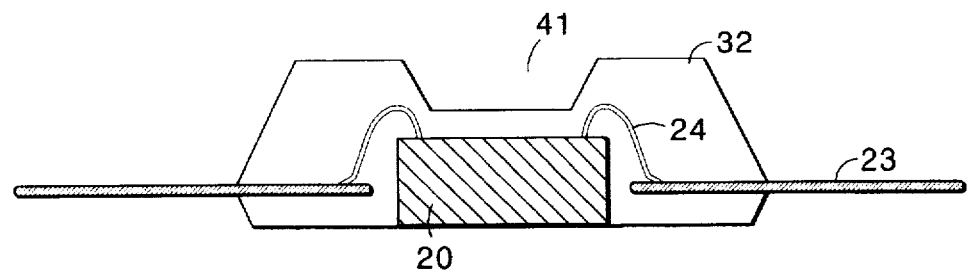
Figure 10:
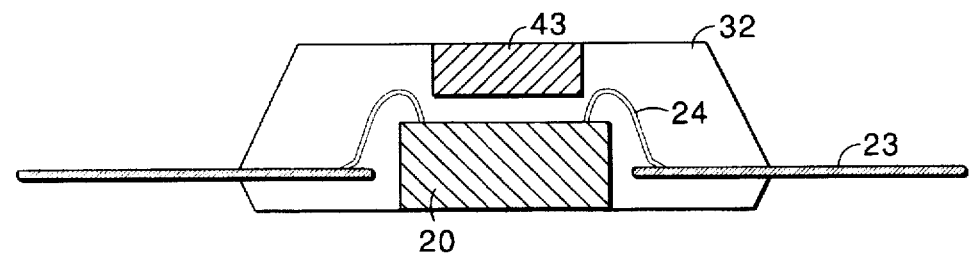
Figure 11:
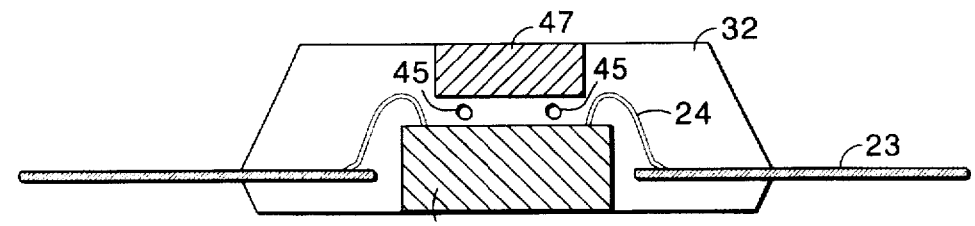

In FIG. 9, a relief notch 41 is provided in the top side of the molded plastic body. Such a relief notch serves to reduce package bending caused by the different coefficients of thermal expansion and chip stress. FIG. 10 depicts a similar chip package featuring, however, a stress relieving insert 43 built into the top side of the molded plastic body. This insert may be selected from any suitable material or combination of materials, such as low expansion silicon, metal, ceramic, and the like. The insert may be positioned by holding it in place during molding with a vacuum port in the top half of the mold. Alternatively, as shown in FIG. 11, may be held in place by bumps 45 which may be made of elastic, plastic, or other materials. As well as providing stress relief, the insert additionally may provide other functions. For example, insert 47 may be a chip capacitor with bumps 45 forming electrical connections to chip 20, in order to provide power supply stabilization. It may also enhance the thermal cooling of the chip. The insert 43 may take on various thicknesses, lengths or widths, and it may be configured to have perforations or other shapes.

Figure 12:
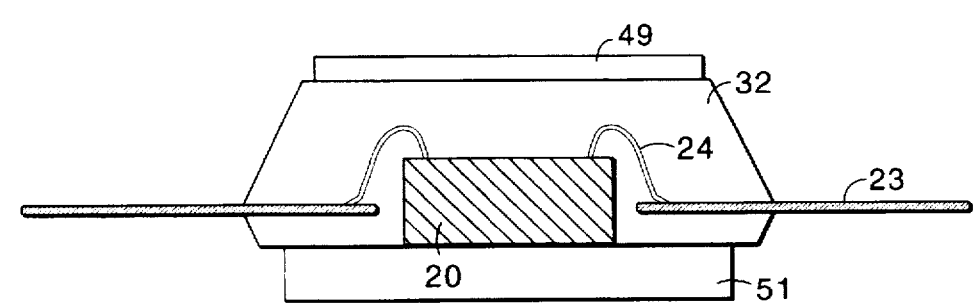

FIG. 12 demonstrates another approach to enhance control of deformations caused by thermal coefficient of expansion (TCE), and reduce cracking and moisture ingress. This embodiment includes a cover or foil 49 on the top side of the package, and cover or foil 51 on the bottom side. It could be held in place during molding or added later.

Figure 13:
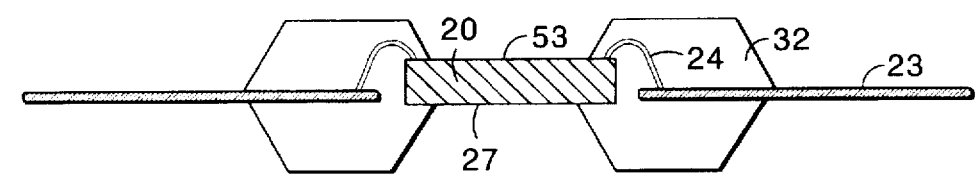

The embodiment illustrated in FIG. 13 features a package with both active front side 53 and non-active back side 27 exposure of chip 20. Such an arrangement might better accommodate electrical connections, testing, enhanced cooling, stress reduction, optical interconnect, and/or an addition wire bonding sequence, and the like.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

We claim:

1. A method of forming a molded semiconductor chip package, the method comprising the steps of:

positioning a semiconductor chip, having an active front side and a nonactive backside, within an opening of a lead frame;

attaching bonding wires between the active front side of the semiconductor chip and bonding pads carried by the lead frame;

holding said semiconductor chip and said lead frame within a package mold by supporting the back side of said semiconductor chip; and forming a molded body within said package mold to encase said semiconductor chip and said lead frame while leaving a substantial portion of the nonactive back side of said semiconductor chip exposed and facing outside the molded semiconductor chip package, said molded body including a stress relief feature which is a ring surrounding the outside edges of the semiconductor chip.

2. The method of claim 1, wherein the step of positioning said semiconductor chip within an opening of a lead frame includes the step of mounting said semiconductor chip on a vacuum pedestal.

3. The method of claim 1, further including the step of holding said nonactive backside of said semiconductor chip within a package mold by supporting said semiconductor chip on a vacuum pedestal.

4. The method of claim 1, wherein said nonactive backside of the semiconductor chip fully unsupported by said lead frame.

5. The method of claim 1, wherein said ring is comprised of lead frame material.

6. A method of forming a molded semiconductor chip package, the method comprising the steps of:

positioning a semiconductor chip, having an active front side and a nonactive backside, within an opening of a lead frame with the nonactive backside of the semiconductor chip fully unsupported by said lead frame;

attaching bonding wires between the active front side of the semiconductor chip and bonding pads carried by the lead frame;

forming a molded body encasing said lead frame and said semiconductor chip with the nonactive back side of said semiconductor chip exposed and facing outside the package and with said molded body including a stress relief notch disposed in said molded body.

7. The method of claim 6, wherein said molded body has a topside and a backside, said topside being a surface of said molded body opposite said nonactive backside of the semiconductor chip, said backside being another surface of said molded body corresponding to said nonactive backside of the semiconductor chip, with said stress relief notch being disposed in said topside of said molded body.

8. The method of claim 6, wherein said molded body has a topside and a backside, said topside being a surface of said molded body opposite said nonactive backside of the semiconductor chip, said backside being another surface of said molded body corresponding to said nonactive backside of the semiconductor chip with said stress relief notch being disposed in said backside of said molded body.

9. The method of claim 6, wherein said molded body has a topside and a backside, said topside being a surface of said molded body opposite said nonactive backside of the semiconductor chip, said backside being another surface of said molded body corresponding to said nonactive backside of the semiconductor chip with said stress relief notch being disposed in said backside of said molded body with said stress relief notch being a first notch disposed in said topside and said molded body further including a second notch disposed in said backside so as to expose both the active front side and the nonactive backside of the semiconductor chip.

10. A method of forming a molded semiconductor chip package, the method comprising the steps of:

positioning a semiconductor chip, having an active front side and a nonactive backside, within an opening of a lead frame with the nonactive backside of the semiconductor chip fully unsupported by said lead frame;

attaching bonding wires between the active front side of the semiconductor chip and bonding pads carried by the lead frame;

forming a molded body encasing said lead frame and the semiconductor chip with the nonactive back side of the semiconductor chip being exposed, said step of forming a molded body further including:

placing an insert in a topside of said molded body, said topside being a surface of said molded body opposite said nonactive backside of the semiconductor chip.

11. The method of claim 10, wherein said insert is one of silicon, metal, and ceramic.

12. The method of claim 10, wherein said insert is a capacitor electrically connected to the semiconductor chip.

13. A method of forming a molded semiconductor chip package, the method comprising the steps of:

positioning a semiconductor chip, having an active front side and a nonactive backside, within an opening of a lead frame with the nonactive backside of the semiconductor chip fully unsupported by said lead frame;

attaching bonding wires between the active front side of the semiconductor chip and bonding pads carried by the lead frame;

forming a molded body encasing said lead frame and said semiconductor chip with the nonactive back side of said semiconductor chip exposed and facing outside the package, said step of forming said molded body including the step of:

bonding a cover to at least one side of the semiconductor chip package as a stress relief feature.

* * * * *